(12) United States Patent
Dewey et al.

(10) Patent No.: US 6,430,729 B1
(45) Date of Patent: Aug. 6, 2002

(54) PROCESS AND SYSTEM FOR MAINTAINING 3 SIGMA PROCESS TOLERANCE FOR PARASITIC EXTRACTION WITH ON-THE-FLY BIASING

(75) Inventors: L. William Dewey, Wappingers Falls, NY (US); Peter A. Habitz, Hinesburg, VT (US); Judith H. McCullen, Essex Junction, VT (US); Edward W. Seibert, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/494,975

(22) Filed: Jan. 31, 2000

(51) Int. Cl.$^7$ ................................................ G06F 17/50
(52) U.S. Cl. ........................................................... 716/4
(58) Field of Search ............................... 716/1, 2, 4–10

(56) References Cited

U.S. PATENT DOCUMENTS 5,901,063 A * 5/1999 Chang ............................ 716/4

* cited by examiner

*Primary Examiner*—Matthew Smith
*Assistant Examiner*—Thuan Do
(74) *Attorney, Agent, or Firm*—McGinn & Gibb, PLLC; Richard M. Kotulak, Esq.

(57) ABSTRACT

A method and structure for a method of determining characteristics of parasitic elements in an integrated circuit comprising, identifying manufacturing process parameters of devices in the integrated circuit, calculating a parasitic performance distribution for each of the devices based on the manufacturing process parameters, combining the parasitic performance distribution for each of the devices into a net parasitic value, and forming a parameterized model based on the net parasitic values.

27 Claims, 2 Drawing Sheets

PROCESS AND SYSTEM FOR MAINTAINING 3 SIGMA PROCESS TOLERANCE FOR PARASITIC EXTRACTION WITH ON-THE-FLY BIASING

BACKGROUND OF THE INVENTION

1. Field of the Invention

The present invention generally relates to identifying parasitic values of devices/networks making up integrated circuits and more particularly to a process and system for maintaining a 3 sigma process tolerance for parasitic extraction with on-the-fly biasing.

2. Description of the Related Art

When integrated circuits are designed, various competing goals must be balanced to achieve a circuit which performs as desired. One such goal is the control of parasitic parameters. For example, coupling capacitances, load capacitances, and wire RC delays are common parasitic parameters. Conventionally, designers prepare a model of an integrated circuit. The model traditionally includes devices such as transistors, capacitors, logic devices, etc. connected by wiring. The parasitic parameters of the devices and the wiring is determined or estimated from previous empirical testing.

In addition, the integrated circuit designer must take into account that the manufacturing process will produce variations (e.g., because of inconsistent processing TEMPERATURE, processing time and material usage) that change the shape, thickness, DENSITY, etc. of the devices and wiring within the integrated circuit design. Therefore, designers accommodate for potential manufacturing process variations by ensuring the circuit will perform as desired within the limits of the manufacturing process variations. Parasitic capacitance and resistance within VLSI (very large scale integration) circuits are calculated using the shapes of the design to determine the horizontal dimensions and the process description for the vertical dimensions. All horizontal dimensions are biased to allow for horizontal shifts during the process, trapezoidal cross-sections and further shifts of the actual physical geometry from the design data caused by manufacturing variations. These biases are different for resistance calculations and capacitance calculations due to variations in the resistivity and dielectric constant within the thickness of the conductor layers.

However, conventional systems suffer from the drawback that only the theoretical maximum and minimum variances within the manufacturing process are considered when performing integrated circuit design. Therefore, conventional systems are designed for potentially unrealistic parasitic values, which limits the designer's ability to efficiently utilize the size of devices and wiring within the integrated circuit design.

SUMMARY OF THE INVENTION

It is, therefore, an object of the present invention to provide a structure and method for determining characteristics of parasitic elements in an integrated circuit comprising, identifying manufacturing process parameters impacting devices in the integrated circuit, calculating a parasitic performance distribution for each of the devices based on the manufacturing process parameters, combining the parasitic performance distribution for each of the devices into a net parasitic value, and forming a parameterized model based on the net parasitic values.

The calculating of the parasitic performance distribution includes simultaneously calculating a range of parasitic values for each of the devices based on the manufacturing process parameters. The range of values includes a best case parasitic value, a worst case parasitic value and a nominal parasitic value. The process also includes deriving parasitic performance values for the devices for the best case parasitic value, the worst case parasitic value and the nominal parasitic value from the parameterized model. The manufacturing process parameters include also different overlay conditions.

The parasitic performance distribution is maintained within a predetermined accuracy range such that the net parasitic value is within the accuracy range. The manufacturing process parameters include a size and spacing of wiring and insulation within layers of the integrated circuit.

The invention described below overcomes these difficulties with a novel system and method which maintains a 3 sigma process tolerance for parasitic extraction. To utilize conventional extraction programs geometric description of the system of conductors and devices is performed at least three times, describing a best case extreme, the nominal design point and a worst case extreme situation. Three extraction runs and three timing evaluations have to be performed. The invention described below allows the same and even more information with one extraction run, gaining a significant performance advantage.

The invention described below also extracts netlists in form of parameterized models for the parasitic elements. This allows the timing tool not only to consider the three situations for which the geometry of the conductors and wires was created, but also all situations in between. Also multiple runs are possible to statistically evaluate all possible combinations of parasitic values with 'Monte Carlo' techniques. Conventional methods do not allow this.

Furthermore, this invention includes a method to account for overlay tolerances in extraction. Overlay variations cause two or more levels to be shifted towards each other, which destroy the symmetry in symmetrically laid out devices. This lack of symmetry impacts stability in storage cells and other circuits which rely on equal devices. The ability to evaluate the loss of divice symmetry due to overlay shifts is also a new feature not described in other extraction tools.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Typically, parasitic capacitance and resistance values of an integrated circuit are determined by the geometry, resistivity, via resistance and dielectric properties. For each main independent process parameter that influences the process parameters, a nominal value and distribution is determined, measured and controlled during manufacturing. Furthermore, the manufacturing process is not exactly reproducible and the value of each process parameter is more accurately modeled by a distribution function, taking into account the variability of the lateral biases, vertical dimensions and material properties. The distribution function is assumed to be the shape of a Gaussian function. The width of this function is expressed in units of sigma, so that 99.73% of all possible values are within a 3 sigma limit.

Key values of the extracted parasitics are coupling capacitances, load capacitances, and wire RC delays. With the invention, the sensitivity of these values to the independent process parameters is established and then used to normalize the parameter variations to achieve a 3 sigma distribution of the combined value.

The invention applies the physical geometry description of the integrated circuit design to calculate parasitic capacitance and resistance extraction. Conventional programs have used the worst case and best case values for each process parameter independently, bringing the final values to a much wider design point than 3 sigma. Conventional methods assume that all process parameters are at a worst condition, a very improbable situation for independent parameter variations. This is a much too conservative assumption that reduces the ability for circuit and product optimization. To the contrary, to ensure that timing calculations are valid within all process comers, the invention calculates all parasitics values at nominal, best case, and worst case process conditions, maintaining the 3 sigma distribution width for the derived extracted parameters. In this way this invention avoids giving away product performance.

Figure 1:
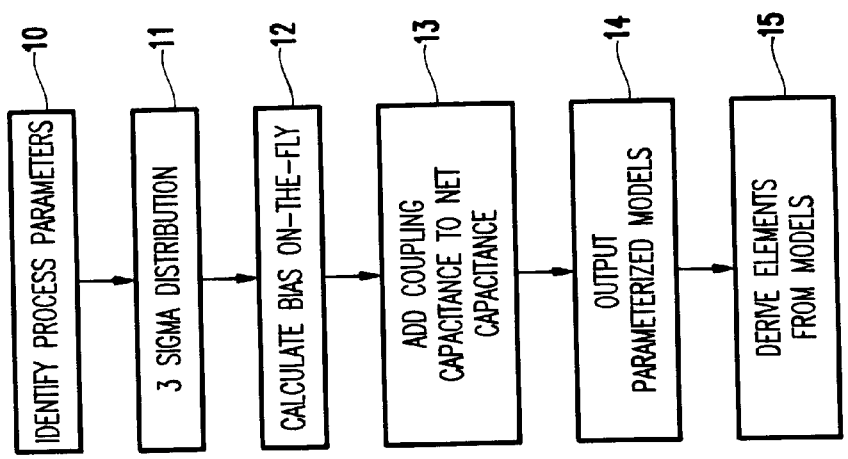
FIG. 1 is a flowchart representation of an embodiment of the invention.

As shown in FIG. 1, the invention first identifies all process parameters that impact the parasitic capacitance and interconnection resistance 10. Then, the invention ensures a 3 sigma distribution for derived parameters using several independent statistical variables 11. During the extraction, the "bias" within parasitic effects caused by manufacturing variations is simultaneously calculated (e.g., "on-the-fly") for the best case, worst-case and normal case manufacturing variations 12. Traditionally, conventional extraction programs calculate best-case and worse-case estimations sequentially and merge the separate extractions into a single combined extraction.

Then, the invention adds coupling capacitance values to net capacitances 13. Using the net capacitances, the invention outputs parameterized models of the integrated circuit 14 and derives elements from the models 15. Each of these processes is discussed below in greater detail.

Figure 2:
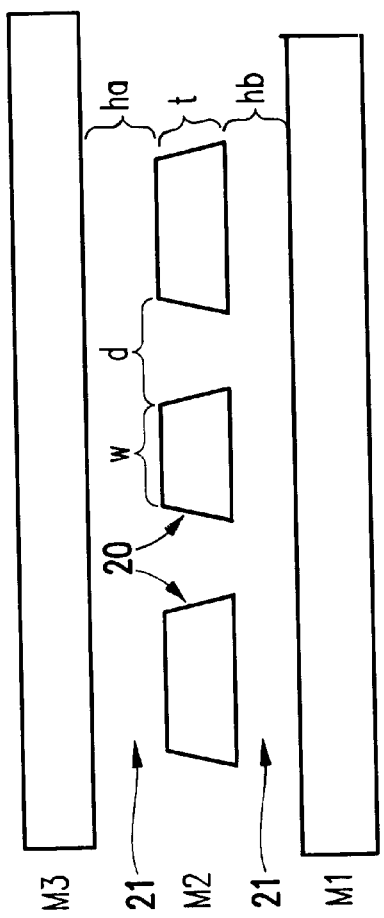
FIG. 2 is a schematic diagram of process parameters impacting parasitic capacitance and interconnect resistance.

FIG. 2 illustrates a number of process parameters that impact the parasitic capacitance and interconnection resistance of an exemplary integrated circuit having metallization layers M1–M3 separated by dielectric insulators 21. The geometric parameters which will be changed by manufacturing process variations include wire width (w), wire thickness (t), space between wires (d), space between layers (above (ha) and below (hb)), and slope of the wires walls 20. Additionally, the insulating characteristics of the dielectrics and the direction and resistivity of the metal M1–M3 will change depending on the respective material composition. In addition environment and pattern density dependent effects on thickness and width and mis-alignment during lithography on different layers will produce manufacturing process variations. The difference between designed width and physical width is called width bias or "bw". The bias contains all lateral process variations and is different for "resistance bias" and "capacitance bias" due to the sloped side wall 20.

All of these parameters can change during processing. Therefore, measurements are taken during manufacturing to control the process and maintain quality. For all regular measured parameters x, the nominal x0 and the 3 sigma width of the distribution are maintained.

For other parameters only nominal values are given. Controlled parameters relevant for the parasitics are: bw, ha, t, hb, rho. (rho is the resistance of a sheet of conductor with thickness t, rho=resistivity/t). The design shapes and the controlled process values are not directly the parameters needed to calculate all the parasitic capacitances and resistances. Therefore, the invention uses derived parameters and additional constants. More specifically, the invention uses for capacitance calculations a space bias "bd." While the space bias is different than the width bias bw used for resistance calculations they are both dependent on the printed width of the conductor. Therefore, the tolerances are dependent on each other as wider wires make smaller spaces, and move together. Not only the wider wires result in low resistance and higher capacitance, but also thicker wires increase capacitance while reducing resistance. This results in the fact that the wire delay, the product of resistance R and capacitance C has a smaller tolerance than either of the two elements R and C.

It is therefore important, that dependent and independent parameters are separated in the treatment and only independent parameters are used in the statistical analysis.

With the invention, the capacitance of a straight piece of conductor depends on C[length, width, space, pattern density][bd, t, ha, hb][$\in_1$, $\in_a$, $\in_b$]. The variable $\in_l$ is the dielectric constant applied for lateral capacitance calculations within the same conductor level, $\in_a$ is the dielectric constant used for capacitance calculations to levels above and $\in_b$ is for levels below. This includes variations in the dielectric materials between the conductor levels.

The first group of parameters (length, width, space, and pattern density of the element/net) are determined by the design. The second group (bd, t, ha, and hb) is known within maximum and minimum manufacturing tolerances. The third group ($\in_l$, $\in_a$, $\in_b$) comprises known constant values.

Figure 3:
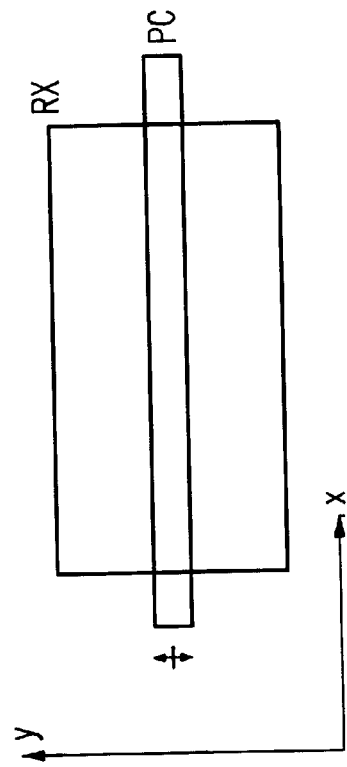
FIG. 3 is a schematic diagram of a feature caused by overlay tolerance.

Similarly, resistance depends on R[length, width, temperature, pattern density ][bw, rho]. The bw bias correlates with the capacitance bd bias and the sheetrho correlates with the wire thickness t.(ρ=resistivity/t). These resistance parameters (bw, ρ) are considered dependent from the capacitance parameters (bd, t, ha, hb) with the invention. Therefore, the variation of resistance follows the determination of the capacitance. Sheetrho variation is added in the parasitic resistance model that is described below. The direction of the variation is also forced to follow the capacitance. This precedence of capacitance is justified, because the performance of 99.9% of all nets is dominated by the capacitance. The invention treats the parameters bd, t, ha, hb as independent statistical parameters with distribution measured in the manufacturing line for the determination of resulting distribution of resistance and capacitance. Another feature of the invention is compensation for overlay tolerance. As shown in FIG. 3, a diffusion shape RX abutting a gate level PC does not only change its size by edge bias but also by shifting the gate (PC) level in X or Y direction towards the diffusion shape RX. This increases one side of the transistor and at the same time reduces the other side. In such a situation, the source and drain would be different sizes and the transistor would be asymmetric. Two equivalently designed nets would have different capacitances and resistances. This can impact circuit stability.

These overlay distributions are caused by the shift of the two mask levels towards each other and are measured in the manufacturing line during the alignment process. The invention accounts for this phenomenon by shifting all coordinates of one level towards +X direction and then extracting the shapes of all devices, shifting them towards −X direction and again extracting all shapes, shifting in +Y direction and −Y direction thereafter. All this is done for every shape effected by the movement of one level. The resulting values for source and drain of the transistors and other especially diode models are transferred as parameters into the models. No other conventional extraction program includes overlay tolerance as a parameter. As mentioned previously, the invention insurers that a three sigma distribution is produced. More specifically, each manufacturing process parameter discussed above (e.g., length, width, etc.) comprises an independent statistical variable that the invention utilizes to produce a 3 sigma distribution of the final extracted circuit elements. More specifically, the invention assumes that capacitance C is linearly dependent on the variation of the independent parameters $x_i$ with the mean value $x0_i$ and the distribution width $sig_i$.

For a set of N measured values $x_{in}$ the mean value is defined as:

$$x0_i = 1/N * \Sigma_n(x_{in})$$

and the distribution width sigma is defined by $$\sigma_i 2 = 1/N \Sigma_n (x_{in} - x0_i)^2.$$

The nominal capacitance C0 is calculated with the mean values $x0_i$. Using the sensitivity defined as $$S_i = dC/dx_i$$

$C(x_i)$ can be linearly approximated to:

$$C(x_i) = C0 + \Sigma_i (S_i * (x_i - x0_i)).$$

The variable $\sigma_c$ is the width of the distribution of C.

$$\sigma_C 2 = 1/N \Sigma_n (C(x_{in}) - C(x0_i))^2$$
$$= 1/N \Sigma_n (\Sigma_i (S_i * (x_{in} - x0_i)))^2$$
$$= 1/N \Sigma_n (\Sigma_i (S_i * (x_{in} - x0_i)))^2 + \Sigma_{ij}(S_i S_j (x_{in} - x0_i) * (x_{jn} - x0_j)).$$

When neglecting cross terms, (e.g., to perform an independent variable approximation):

$$\sigma_C 2 = \Sigma_i (S_i 2 * 1/N \Sigma_n (x_{in} - x0_i)^2).$$

Therefore, $$\sigma_C = \sqrt{\Sigma i (Si * \sigma i) 2} \tag{1}$$

This formula (eq. 1) is used throughout, and is referred to herein as "RSS".

The "endpoints" of the distribution in C is a set of $x_i$ giving $$C = C0 +- \Sigma_c$$

This one equation does not uniquely define the values for the N variables $x_i$ which all change the value of C.

To overcome this problem, the invention calculates the endpoints with a unique set of parameters. The invention uses a new parameter f which moves all process parameters at the same time towards larger C for worst case, (Si>0) and smaller C for best case using the following:

$$C(f) = C(x0_i +- f * \sigma_i)$$
$$= C0 +- dC/df$$
$$= C0 +- f * \Sigma_i (|S_i| * \sigma_i).$$

Setting $$\sigma_C = f * \Sigma_i (|S_i| * \sigma_i)$$

determines the value of f:

$$f = \sqrt{(\Sigma i (Si * \sigma i) 2)/(\Sigma i (|Si| * \sigma i))} \tag{2}$$

By calculating the capacitance at the limits of the distribution set to $x0_i +- f * \sigma_i$ the invention avoids too much pessimism and maintains the width of the distribution. This allows the designer to optimize the circuit more thoroughly and hence deliver better performance products. The calculations are then simultaneously performed at three process points nominal NOM: $x0_i$, best-case BC: $x0_i - f * \sigma_i$, and worst-case WC: $x0_i + f * \sigma_i$ Thus, the invention maintains the width of the distribution for calculated value derived from several independent parameters.

As discussed above, the invention performs all the above processing "on-the-fly" to increase efficiency. During parasitic parameter extraction, all parasitic effects are measured using design dimensions. All calculations of resistances, capacitances, areas, and perimeters are performed simultaneously applying the nominal, best case, and worst case biases. Three values for all extracted parameters are maintained throughout the extraction process. This avoids the sequential runs that conventional systems require, which makes the invention almost three times more efficient than conventional systems, because most of the computer time is used to find all corners of the designs on all levels and recognize their relationship. Further, when using competitive tools, it is necessary to merge the separately calculated distinct net lists, if parameterized models are the purpose of the extraction. However, such netlist merging is very difficult because parasitic resistances or capacitances can vanish due to biasing. The invention avoids this problem by creating the netlist only once with nominal bias and then re-calculating all capacitance and resistance values with the different bias point. When the bias removes a shape, the resulting value will be small, but the netlist topology will not change, as there is only one. As mentioned above, the invention adds coupling capacitance values to net capacitances. All extraction programs calculate capacitance elements for every adjacent edge and common surface between conductors. Depending to which net each the conductor belongs, the components are then added to the net capacitances. During this process the width of the distribution is maintained.

To do this, the invention sorts the capacitance components of the net capacitances into those which are formed out of groups of process parameters being statistically independent from those not being statistically independent, when adding coupling capacitance's between conductors to net capacitances.

Capacitances depending on the same parameters (e.g., not independent) are added directly: $C(WC) = \Sigma(C_{lk}(WC))$. The same process is used for NOM and BC. Those which are independent are added using equation 1 with the sensitivity s=1: $C(WC) = C(NOM) + \sqrt{(\Sigma(Clk(WC) - Clk(NOM))2))}$ $C(NOM) = \Sigma(C_{lk}(NOM))$, $C(BC) = C(NOM) - \sqrt{(\Sigma(Clk(BC) - Clk(NOM))2))}$ This method maintains the 3 sigma distribution width and avoids the significant widening of distributions when for example M1 and M2 capacitances are added to net capacitances. This is easily a 30% advantage in the distribution width over the direct summation depending on the size of the contributions from different levels.

As mentioned above, the invention outputs all parasitic values as parameterized models, not simple elements. For example, parameterized models for capacitance include the three values at the process comers. The parameterized models for resistance include three values for the number of squares together at a given metalization level and the minimum width (for electromigration checking). Resistance is equal to the number of squares times the sheetrho. The number of squares for rectangular shape is equal to length over width.

The parameterized models for the diffusion capacitance includes three values for area and perimeter of the metalization level being measured.

Another important parasitic parameter considered by the invention is the junction capacitance of the diffused regions. The size of these voltage dependent parameters depend on the area and the perimeter of the shape. Here only one statistical parameter (e.g., the bias) is needed to determine the appropriate value of area and perimeter. No statistical on-the-fly processing is needed to calculate area and perimeter and the variation of the impurity profile dependent parameters is included in the model. In case overlay tolerance is requested, the values for the parameterized resistance and diffusion capacitance models are given for positive and negative shift in X and Y direction.

Thus, the invention allows statistical simulations to give the full distribution of parasitic parameters. With the invention, the simulation tools can use the statistical mixing of different parameters.

As also mentioned above, the invention derives element from the models. More specifically, the models can be transferred into primitives for static timing applications. This translation can be done at any point in the statistical distribution for any environment, not only at the middle and end points. The invention uses formula 2 to ensures that the results stay at the 3 sigma limit. The parameters in the parasitic element model describe the middle and endpoints of the distribution of this element. In the total circuit this is only one part impacting the overall performance of this circuit. Other independent elements like the current distribution of the transistors also impact the variation of the circuit performance with process changes. The method described with formula 2 can also be used to set f. The variable f can be used when translating the models to elements to adjust to the capabilities of static timing tools, which can not use the parasitic models. This leads to tighter distribution in the overall performance and a better product.

The invention is especially useful for evaluating the sensitivity of results to process parameters changes. This provides feedback to the process development engineer for importance of process parameter control and optimization towards final circuit performance, stability, or any other electrical measurement. Therefore, the processing discussed above can be easily repeated using the revised/modified circuit design.

Figure 4:
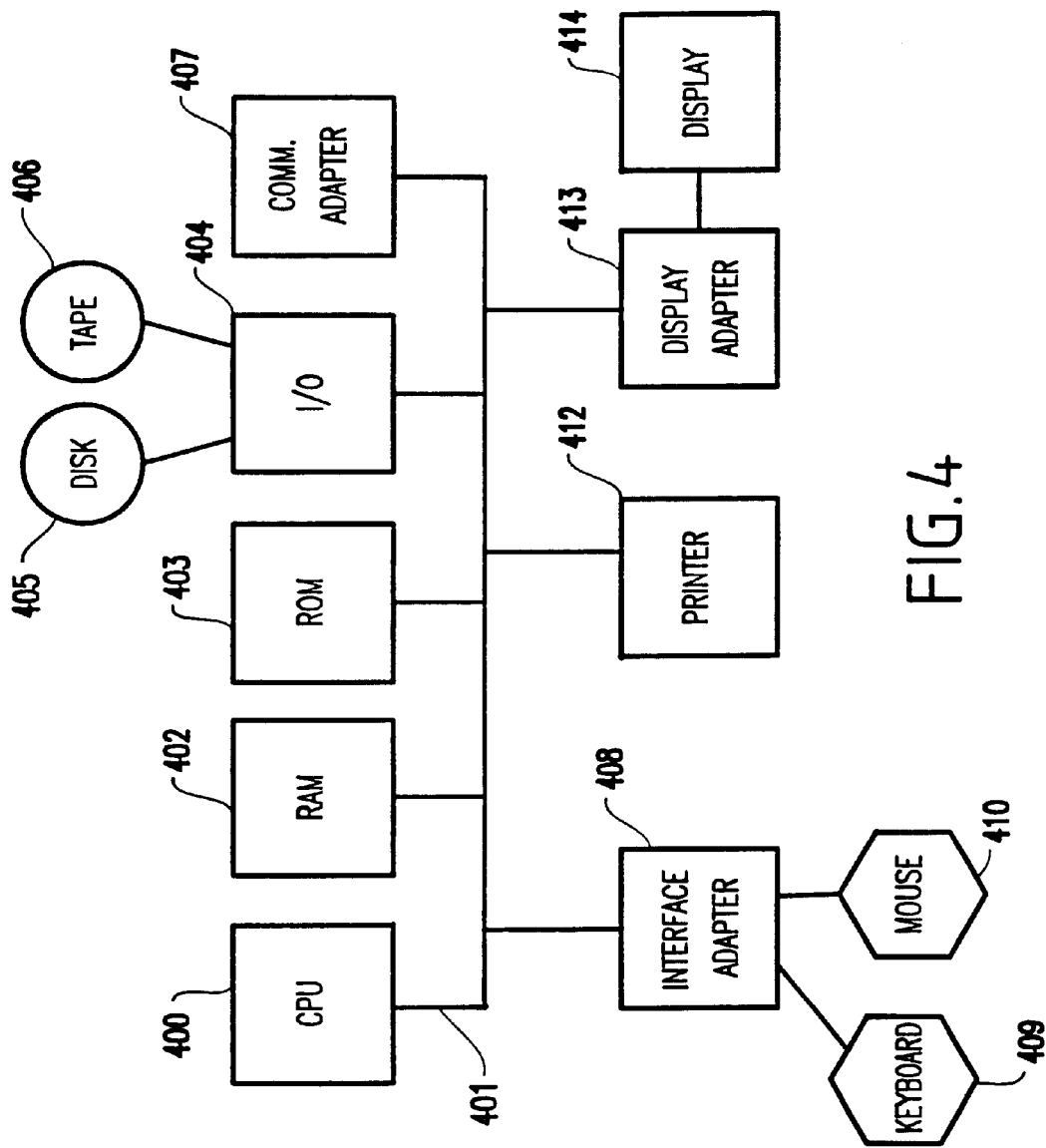
FIG. 4 is a hardware embodiment of the invention.

While the overall methodology of the invention is described above, the invention can be embodied in any number of different types of systems and executed in any number of different ways, as would be known by one ordinarily skilled in the art. For example, as illustrated in FIG. 4, a typical hardware configuration of an information handling/computer system in accordance with the invention preferably has at least one processor or central processing unit (CPU) 400. For example, the central processing unit 400 could include various image/texture processing units, mapping units, weighting units, adders, subtractors, comparators, etc. Alternatively, as would be known by one ordinarily skilled in the art given this disclosure, multiple specialized CPU=s (or other similar individual functional units) could perform the same processing, mapping, weighting, adding, subtracting, comparing, etc.

The CPU 400 is interconnected via a system bus 401 to a random access memory (RAM) 402, read-only memory (ROM) 403, input/output (I/O) adapter 404 (for connecting peripheral devices such as disk units 405 and tape drives 406 to the bus 401), communication adapter 407 (for connecting an information handling system to a data processing network) user interface adapter 408 (for connecting a peripherals 409, 410 such as a keyboard, mouse, microphone speaker and/or other user interface device to the bus 401), a printer 412, and display adapter 413 (for connecting the bus 401 to a display device 414). The invention could be implemented using the structure shown in FIG. 4 by including the inventive method within a computer program stored on the storage device 405. Such a computer program would act on information, such as the manufacturing variables supplied through the interface units 409, 410 or through the network connection 407. The system would then automatically produce the parameterized parasitic values on the display 414, through the printer 412 or back to the network 407.

Thus, as shown above, the invention calculates parasitics parameters for all three process comers on the fly by simultaneously computing 3 values every time a parasitic component is calculated. The invention is almost three times faster than conventional systems. Further, the invention requires only one netbuild, one trapezoidal decomposition, and one shape preparation step instead of three, for each process comer.

An important feature is the way in which the invention combines independent tolerances across levels. When combining total capacitances per net, the calculated values per level are statistically combined to achieve the correct total tolerances. This reduces the total distribution of the capacitance per net significantly.

The invention delivers a tighter more accurate parameter distribution and allows statistical timing analysis, not only on the end points of a truly 3 sigma process, but also on any other point of the distribution. Further, this unique capability does not significantly impact the extraction capability or speed of the invention.

Thus, the invention maintains 3 sigma tolerance throughout to avoid unnecessary pessimism in the design resulting in a faster product. Also, as mentioned above the invention includes 'unusual' variations as overlay. The invention delivers parasitic models with parameters to allow statistical performance studies, when the timing tool can accommodate such information. Further, as shown above, the invention presents an efficient way to perform such processing with on the fly biasing. The invention provides feedback to process development engineers about the impact of the manufacturing process control on the final product, which allows focus to be concentrated on the right process sensitivities.

While the invention has been described in terms of preferred embodiments, those skilled in the art will recognize that the invention can be practiced with modification within the spirit and scope of the appended claims.

What is claimed is:

1. A method of determining characteristics of parasitic elements in an integrated circuit comprising:

identifying manufacturing process parameters comprising best case manufacturing parameters, worst case manufacturing parameters, and nominal manufacturing parameters of devices in said integrated circuit;

calculating a parasitic performance distribution for each of said devices based on said manufacturing process parameters;

combining said parasitic performance distribution for each of said devices into a net parasitic value for said integrated circuit; and forming a parameterized model based on said net parasitic values.

2. The method in claim 1, wherein said calculating of said parasitic performance distribution comprises simultaneously calculating a range of parasitic values for each of said devices based on said manufacturing process parameters.

3. The method in claim 2, wherein said range of values includes a best case parasitic value, a worst case parasitic value and a nominal parasitic value.

4. The method in claim 3, further comprising deriving parasitic performance values for said devices within said best case parasitic value, said worst case parasitic value and said nominal parasitic value from said parameterized model.

5. The method in claim 1, wherein said manufacturing process parameters account for different overlay conditions.

6. The method in claim 1, wherein said parasitic performance distribution is maintained within a predetermined accuracy range such that said net parasitic value is within said accuracy range.

7. The method in claim 1, wherein said manufacturing process parameters include a size and spacing of wiring and insulation within layers of said integrated circuit.

8. A method of determining characteristics of parasitic elements in an integrated circuit comprising:

identifying manufacturing process parameters comprising best case manufacturing parameters, worst case manufacturing parameters, and nominal manufacturing parameters of devices in said integrated circuit;

simultaneously calculating a range of parasitic values for each of said devices based on said manufacturing process parameters to produce a parasitic performance distribution;

combining said parasitic performance distribution for each of said devices into a net parasitic value for said integrated circuit; and forming a parameterized model based on said net parasitic values.

9. The method in claim 8, wherein said range of values includes a best case parasitic value, a worst case parasitic value and a nominal parasitic value.

10. The method in claim 9, further comprising deriving parasitic performance values for said devices outside said best case parasitic value, said worst case parasitic value and said nominal parasitic value from said parameterized model.

11. The method in claim 8, wherein said manufacturing process parameters account for different overlay conditions.

12. The method in claim 8, wherein said parasitic performance distribution is maintained within a predetermined accuracy range such that said net parasitic value is within said accuracy range.

13. The method in claim 12, wherein said accuracy range comprises 3 sigma points including best case, worst case, and nominal case.

14. The method in claim 8, wherein said manufacturing process parameters include a size and spacing of wiring and insulation within layers of said integrated circuit.

15. A method of determining characteristics of parasitic elements in an integrated circuit comprising:

identifying manufacturing process parameters comprising best case manufacturing parameters, worst case manufacturing parameters, and nominal manufacturing parameters of devices in said integrated circuit, wherein said manufacturing process parameters account for different overlay conditions;

calculating a parasitic performance distribution for each of said devices based on said manufacturing process parameters;

combining said parasitic performance distribution for each of said devices into a net parasitic value for said integrated circuit; and forming a parameterized model based on said net parasitic values.

16. The method in claim 15, wherein said calculating of said parasitic performance distribution comprises simultaneously calculating a range of parasitic values for each of said devices based on said manufacturing process parameters.

17. The method in claim 16, wherein said range of values includes a best case parasitic value, a worst case parasitic value and a nominal parasitic value.

18. The method in claim 17, further comprising deriving parasitic performance values for said devices within said best case parasitic value, said worst case parasitic value and said nominal parasitic value from said parameterized model.

19. The method in claim 15, wherein said parasitic performance distribution is maintained within a predetermined accuracy range such that said net parasitic value is within said accuracy range.

20. The method in claim 15, wherein said manufacturing process parameters include a size and spacing of wiring and insulation within layers of said integrated circuit.

21. A program storage device readable by machine, tangibly embodying a program of instructions executable by the machine to perform a method of determining characteristics of parasitic elements in an integrated circuit, said method comprising:

identifying manufacturing process parameters comprising best case manufacturing parameters, worst case manufacturing parameters, and nominal manufacturing parameters of devices in said integrated circuit;

calculating a parasitic performance distribution for each of said devices based on said manufacturing process parameters;

combining said parasitic performance distribution for each of said devices into a net parasitic value for said integrated circuit; and forming a parameterized model based on said net parasitic values.

22. The program storage device in claim 21, wherein said calculating of said parasitic performance distribution comprises simultaneously calculating a range of parasitic values for each of said devices based on said manufacturing process parameters.

23. The program storage device in claim 22, wherein said range of values includes a best case parasitic value, a worst case parasitic value and a nominal parasitic value.

24. The program storage device in claim 23, said method further comprising deriving parasitic performance values for said devices outside said best case parasitic value, said worst case parasitic value and said nominal parasitic value from said parameterized model.

25. The program storage device in claim 21, wherein said manufacturing process parameters account for different overlay conditions.

26. The program storage device in claim 21, wherein said parasitic performance distribution is maintained within a predetermined accuracy range such that said net parasitic value is within said accuracy range.

27. The program storage device in claim 21, wherein said manufacturing process parameters include a size and spacing of wiring and insulation within layers of said integrated circuit.

* * * * *